US010381330B2

(12) United States Patent
Sato et al.

(10) Patent No.: US 10,381,330 B2
(45) Date of Patent: Aug. 13, 2019

(54) SACRIFICIAL ALIGNMENT RING AND SELF-SOLDERING VIAS FOR WAFER BONDING

(71) Applicant: Silicon Storage Technology, Inc., San Jose, CA (US)

(72) Inventors: Justin Hiroki Sato, West Linn, OR (US); Bomy Chen, Newark, CA (US); Walter Lundy, Gilbert, AZ (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/921,563

(22) Filed: Mar. 14, 2018

(65) Prior Publication Data

US 2018/0286836 A1 Oct. 4, 2018

Related U.S. Application Data

(60) Provisional application No. 62/477,963, filed on Mar. 28, 2017.

(51) Int. Cl.
*H01L 23/48* (2006.01)
*H01L 25/065* (2006.01)
(Continued)

(52) U.S. Cl.
CPC .......... *H01L 25/0657* (2013.01); *H01L 24/05* (2013.01); *H01L 24/16* (2013.01); *H01L 24/81* (2013.01); *H01L 25/50* (2013.01); *H01L 2224/0217* (2013.01); *H01L 2224/0219* (2013.01); *H01L 2224/04042* (2013.01); *H01L 2224/05091* (2013.01);
(Continued)

(58) Field of Classification Search
CPC ............................ H01L 25/0657; H01L 25/50
See application file for complete search history.

(56) References Cited

U.S. PATENT DOCUMENTS 5,770,889 A 6/1998 Rostoker et al.
5,821,625 A * 10/1998 Yoshida ................ H01L 21/563 257/777

(Continued)

FOREIGN PATENT DOCUMENTS

CN 102403308 A 4/2012
CN 102891114 A 1/2013

(Continued)

*Primary Examiner* — Didarul A Mazumder
*Assistant Examiner* — Wasiul Haider
(74) *Attorney, Agent, or Firm* — DLA Piper LLP (US)

(57) ABSTRACT

A method of bonding a first substrate to a second substrate, wherein the first substrate includes first electrical contacts on a top surface of the first substrate, and wherein the second substrate includes second electrical contacts on a bottom surface of the second substrate. The method includes forming a block of polyimide on the top surface of the first substrate, wherein the block of polyimide has a rounded upper corner, and vertically moving the top surface of the first substrate and the bottom surface of the second substrate toward each other until the first electrical contacts abut the second electrical contacts, wherein during the moving, the second substrate makes contact with the rounded upper corner of the polyimide causing the first and second substrates to move laterally relative to each other.

21 Claims, 15 Drawing Sheets

(51) Int. Cl.
*H01L 23/00* (2006.01)
*H01L 25/00* (2006.01)

(52) U.S. Cl.
CPC ............... *H01L 2224/05124* (2013.01); *H01L 2224/16502* (2013.01); *H01L 2224/81143* (2013.01); *H01L 2224/81805* (2013.01); *H01L 2225/06513* (2013.01); *H01L 2225/06555* (2013.01); *H01L 2225/06593* (2013.01); *H01L 2924/0105* (2013.01); *H01L 2924/01029* (2013.01); *H01L 2924/07025* (2013.01)

(56) References Cited

U.S. PATENT DOCUMENTS 6,110,806 A 8/2000 Pogge
2009/0243118 A1* 10/2009 Akiba ..................... H01L 22/14 257/773
2011/0006433 A1* 1/2011 Kanetaka .......... H01L 23/49816 257/773
2013/0026643 A1 1/2013 England et al.
2013/0241057 A1* 9/2013 Yu ....................... H01L 25/0657 257/738
2015/0228587 A1 8/2015 Cheng et al.
2016/0086867 A1* 3/2016 Tu ........................... H01L 21/78 257/737
2016/0211485 A1* 7/2016 Lee ..................... H01L 51/5231
2017/0266765 A1* 9/2017 Zhang .................. B23K 35/264
2018/0102346 A1* 4/2018 Yamada .................. H01L 25/50

FOREIGN PATENT DOCUMENTS

CN 102916915 A 2/2013
CN 102931167 A 2/2013
CN 102937945 A 2/2013
CN 102945823 A 2/2013
CN 102970254 A 3/2013
CN 103019303 A 4/2013
CN 105468569 A 4/2016

* cited by examiner

SACRIFICIAL ALIGNMENT RING AND SELF-SOLDERING VIAS FOR WAFER BONDING

RELATED APPLICATIONS

This application claims the benefit of U.S. Provisional Application No. 62/477,963, filed Mar. 28, 2017, and which is incorporated herein by reference.

FIELD OF THE INVENTION

The present invention relates to semiconductor manufacturing processes, and specifically to bonding semiconductor die to semiconductor wafers.

BACKGROUND OF THE INVENTION

Currently, conventional die stacking processes are incapable of successfully bonding a die to a wafer with the desired precision for some applications. For example, there are applications that call for bonding a die containing one type of circuitry (e.g., digital processing circuitry) to a wafer containing another type of circuitry (e.g., analog circuits and memory). The die includes electrical connectors (e.g., exposed conductors or pads) that contact and connect with reciprocal connectors on the wafer. For successful bonding, the connectors need to be aligned to each other before bonding, so that reliable electrical connections are formed when the die is bonded to the wafer. However, as device geometries continue to shrink, it becomes more difficult to align the die to the wafer (and more specifically the connectors of each) before bonding so that the electrical connections between the two are made at the point bonding occurs. Obtaining the desired alignment can require very expensive and complex alignment equipment. Moreover, pressing connectors together does not always generate an immediate and/or long lasting electrical connection.

One solution has been proposed where alignment structures are formed adjacent the bond site to guide a misaligned die into proper alignment during bonding. As the die is lowered onto the wafer, if there is any misalignment, the die physically hits the alignment structure and is moved laterally by that physical contact such that by the time the die reaches the wafer, the two are properly aligned to each other. Conventional attempts using this alignment technique have used materials such as Al, silicon dioxide, or silicon nitride for the alignment structure. However, these materials lack sufficient elasticity to effectively guide the die laterally upon physical contact (there is excessive damage to both the alignment structure and the die), and it was difficult to create deep enough alignment structures using such materials. The collision of the die with such rigid alignment structures does not effectively guide the die into proper position. Chinese patent publication CN 102403308 proposed using a polymer for the alignment structure, but it did not identify any specific polymer to implement this solution. While many types of polymers are more elastic than Al, oxide or nitride, they are too soft at the high temperatures necessary during bonding (e.g., greater than 100 C) to act as alignment structures, and they typically burn at such temperatures.

There is a need for an alignment structure and technique that reliably aligns die to wafer without using expensive and complex alignment equipment, yet effectively allows for the creation of electrical connections between die and wafer when bonded together.

BRIEF SUMMARY OF THE INVENTION

The aforementioned problems and needs are addressed by a method of bonding a first substrate to a second substrate, wherein the first substrate includes first electrical contacts on a top surface of the first substrate, and wherein the second substrate includes second electrical contacts on a bottom surface of the second substrate. The method includes forming a block of polyimide on the top surface of the first substrate, wherein the block of polyimide has a rounded upper corner, and vertically moving the top surface of the first substrate and the bottom surface of the second substrate toward each other until the first electrical contacts abut the second electrical contacts, wherein during the moving, the second substrate makes contact with the rounded upper corner of the polyimide causing the first and second substrates to move laterally relative to each other.

A method of bonding a first substrate to a second substrate, wherein the first substrate includes first electrical contacts on a top surface of the first substrate, and wherein the second substrate includes second electrical contacts on a bottom surface of the second substrate. The method includes forming a first material over the top surface of the first substrate and over the first electrical contacts, forming vias extending through the first material to expose the first electrical contacts, forming Sn—Cu material in the vias, forming a layer of polyimide over the top surface of the first substrate, selectively removing one or more portions of the layer of polyimide, leaving a block of the polyimide over the top surface of the first substrate, wherein the block of polyimide has a rounded upper corner, and vertically moving the top surface of the first substrate and the bottom surface of the second substrate toward each other until the Sn—Cu material abuts the second electrical contacts, wherein during the moving, the second substrate makes contact with the rounded upper corner of the polyimide causing the first and second substrates to move laterally relative to each other.

A bonded assembly that includes a first substrate having a top surface and first electrical contacts on the top surface, a second substrate having a bottom surface and second electrical contacts on the bottom surface, and a plurality of blocks of Sn—Cu material each being disposed between and in electrical contact with one of the first electrical contacts and one of the second electrical contacts.

Other objects and features of the present invention will become apparent by a review of the specification, claims and appended figures.

DETAILED DESCRIPTION OF THE INVENTION

Figure 1:
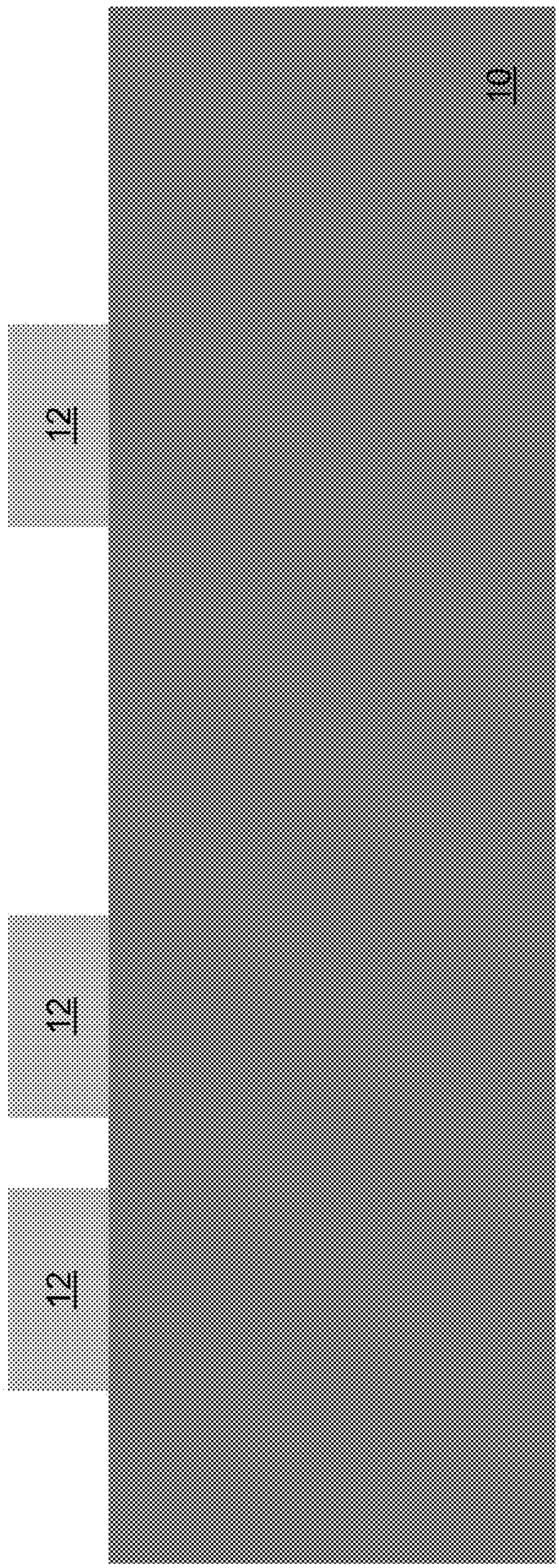
FIGS. 1-9 are cross sectional side views illustrating the steps in forming the polyimide alignment structure.
Figure 2:
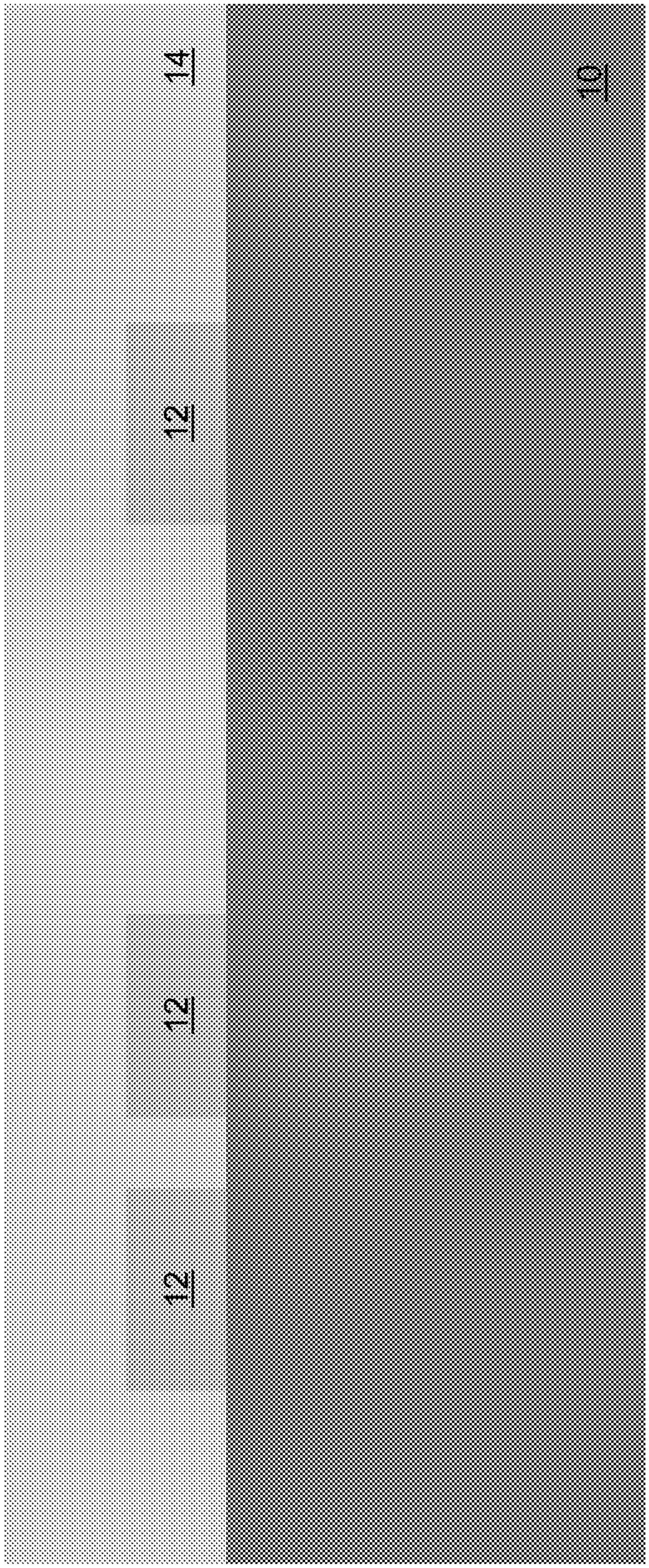
Figure 3:
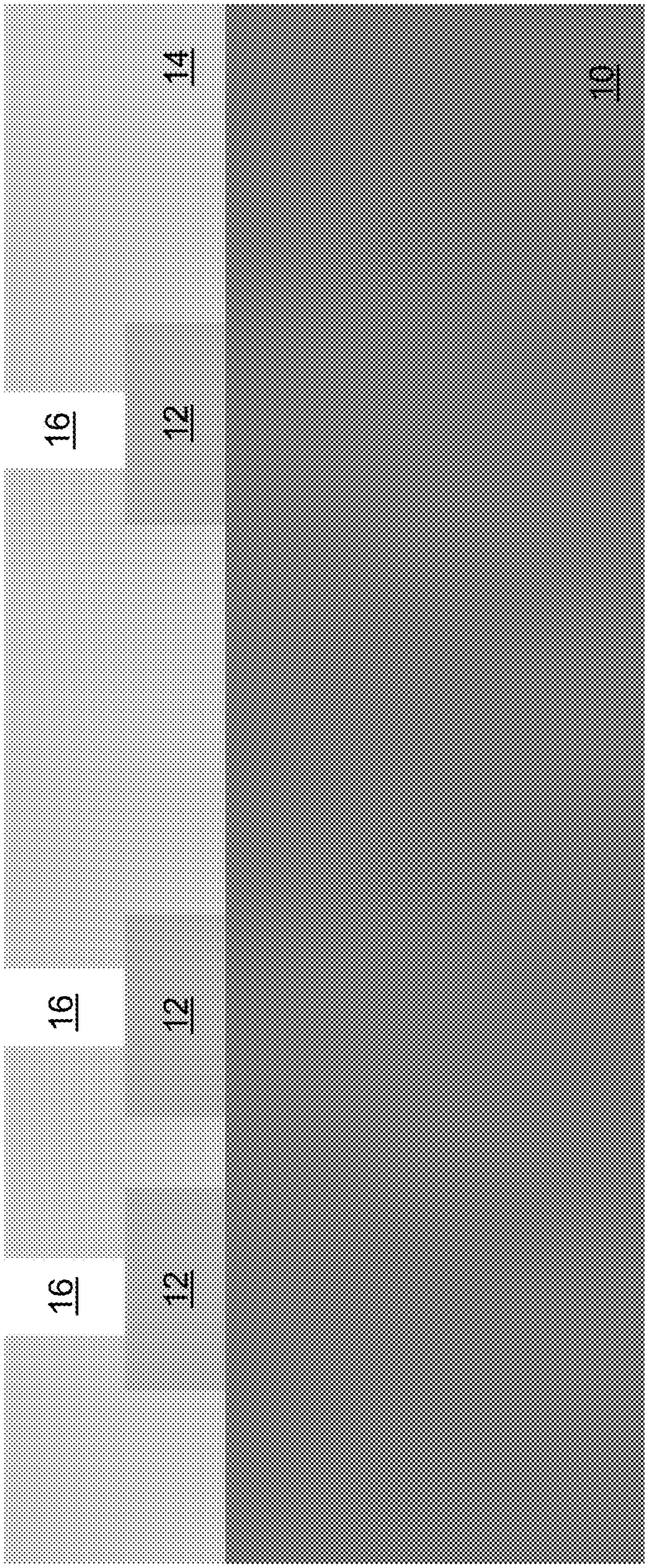

The present invention is an alignment and electrical connection technique and alignment structure for bonding the bottom surface of a die to a top surface of a wafer. The wafer can include a substrate 10 on which circuitry and other conductive elements are formed and is shown in FIG. 1 (without showing the circuitry formed thereon), and includes vertically extending metal contacts 12 at the substrate's top surface. To facilitate bonding and the electrical connections between the metal contacts 12 and a die, a layer of insulation material 14 (e.g., inter-layer dielectric IMD) is formed over the structure and planarized, as shown in FIG. 2. Vias 16 are formed in the insulation 14, with each via 16 extending down to and exposing one of the metal contacts 12, as shown in FIG. 3. The vias 16 can be formed using a photolithography process, where photo resist is formed over the insulation 14 and selectively exposed and developed using a mask. Selective portions of the photo resist are then removed, exposing the insulation 14 above each metal contact. Then an etch is performed on the exposed portions of insulation 14 to create the vias 16 therein.

Figure 4:
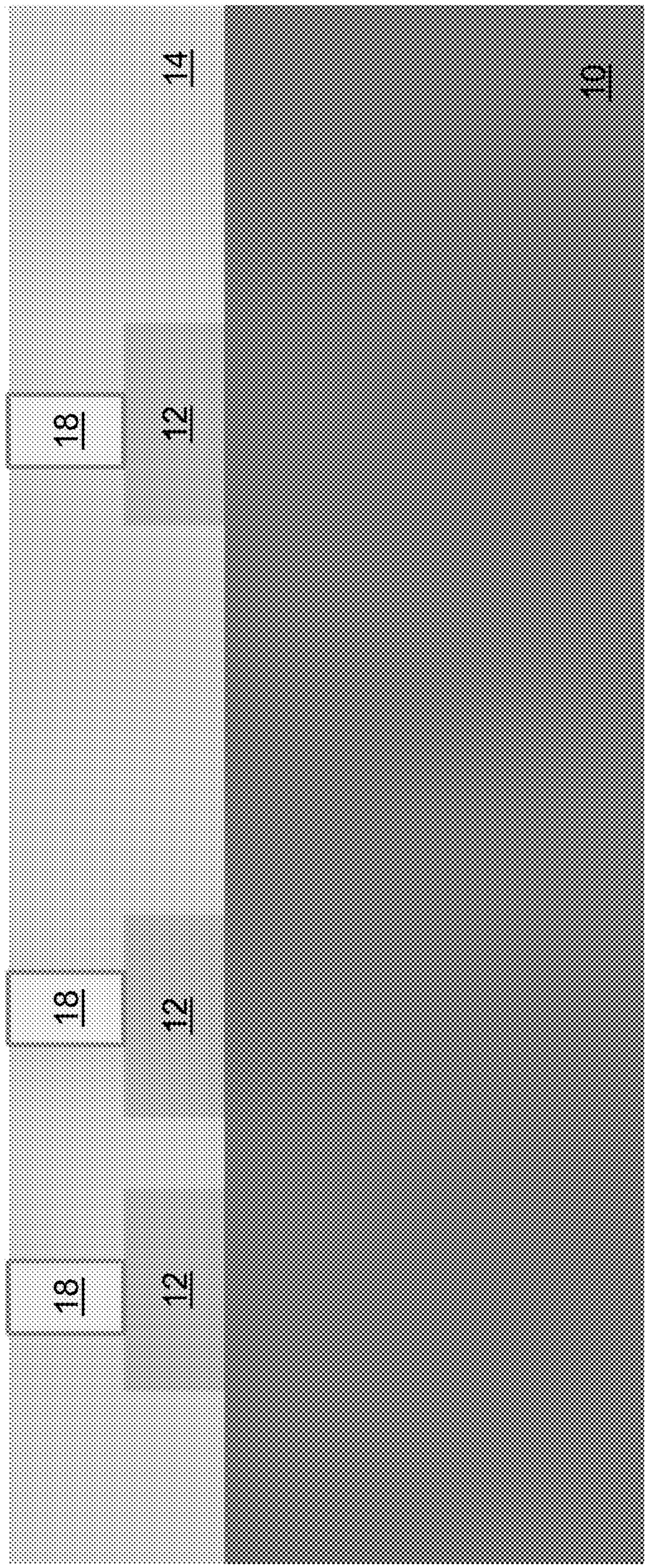
Figure 5:
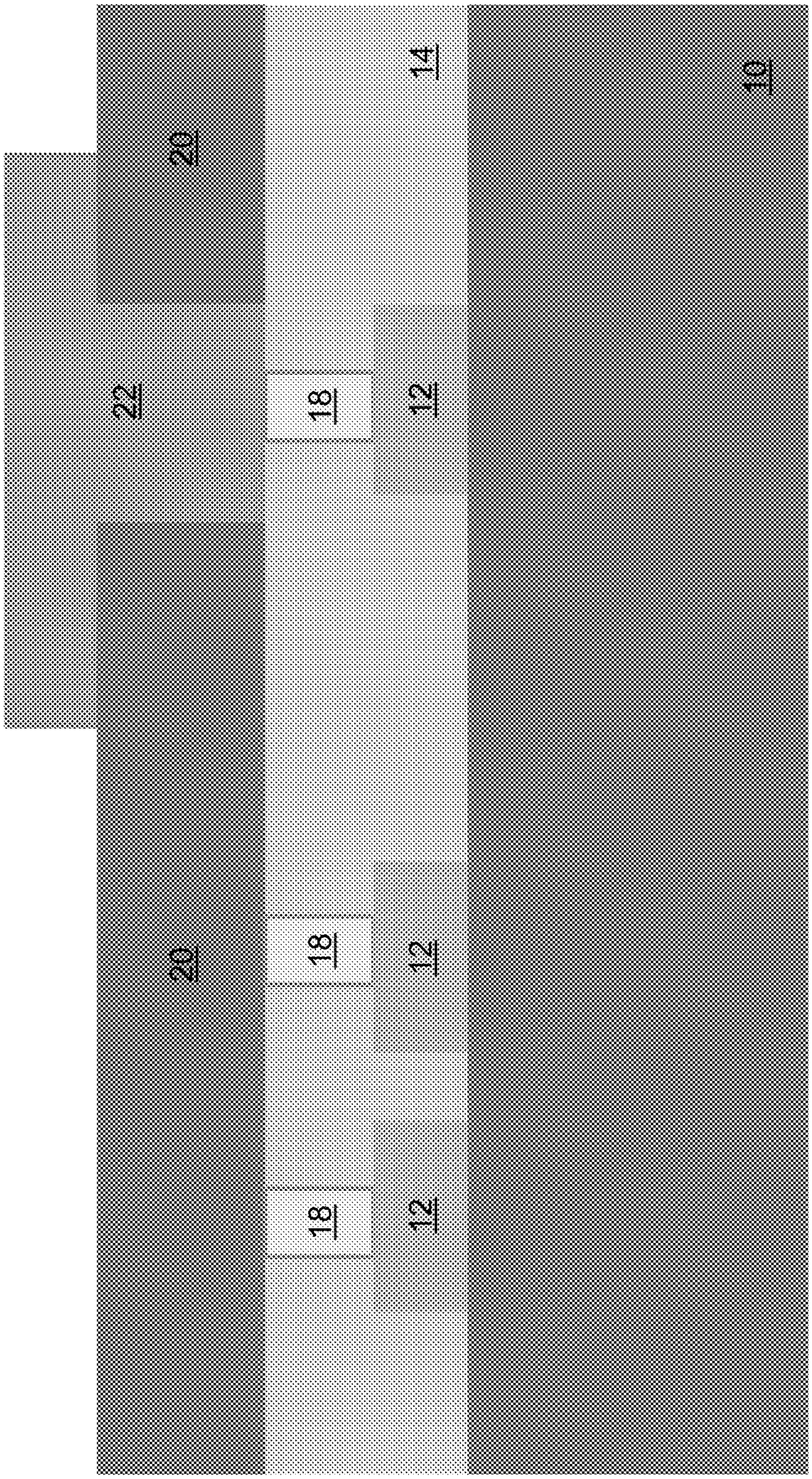

A layer of Sn—Cu alloy is deposited over the structure, filling the vias 16. The Sn—Cu alloy is then dry etched or polished back using a chemical mechanical polish (CMP) so that the Sn—Cu alloy is removed from the top surface of the insulation 14, but leaves the vias filled with Sn—Cu contacts 18, as shown in FIG. 4. A passivation layer 20 (of inorganic material such as oxide or nitride) is formed over the structure. Aluminum pads 22 can be formed over some of the Sn—Cu contacts 18, by selectively etching through the passivation layer 20, covering the structure with aluminum, and performing an aluminum etch to remove the aluminum except where the passivation layer was etched, as shown in FIG. 5.

Figure 6:
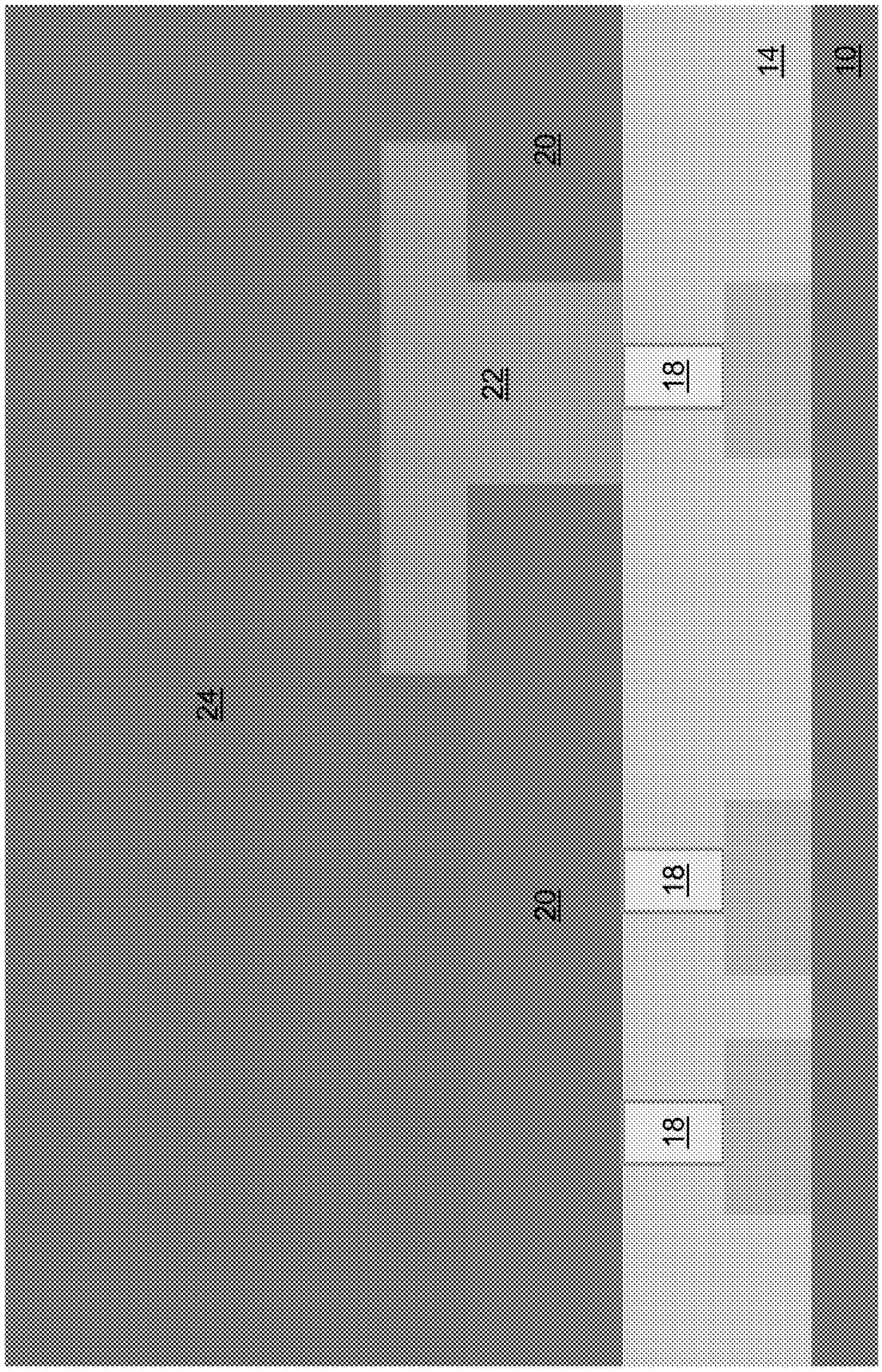
Figure 7:
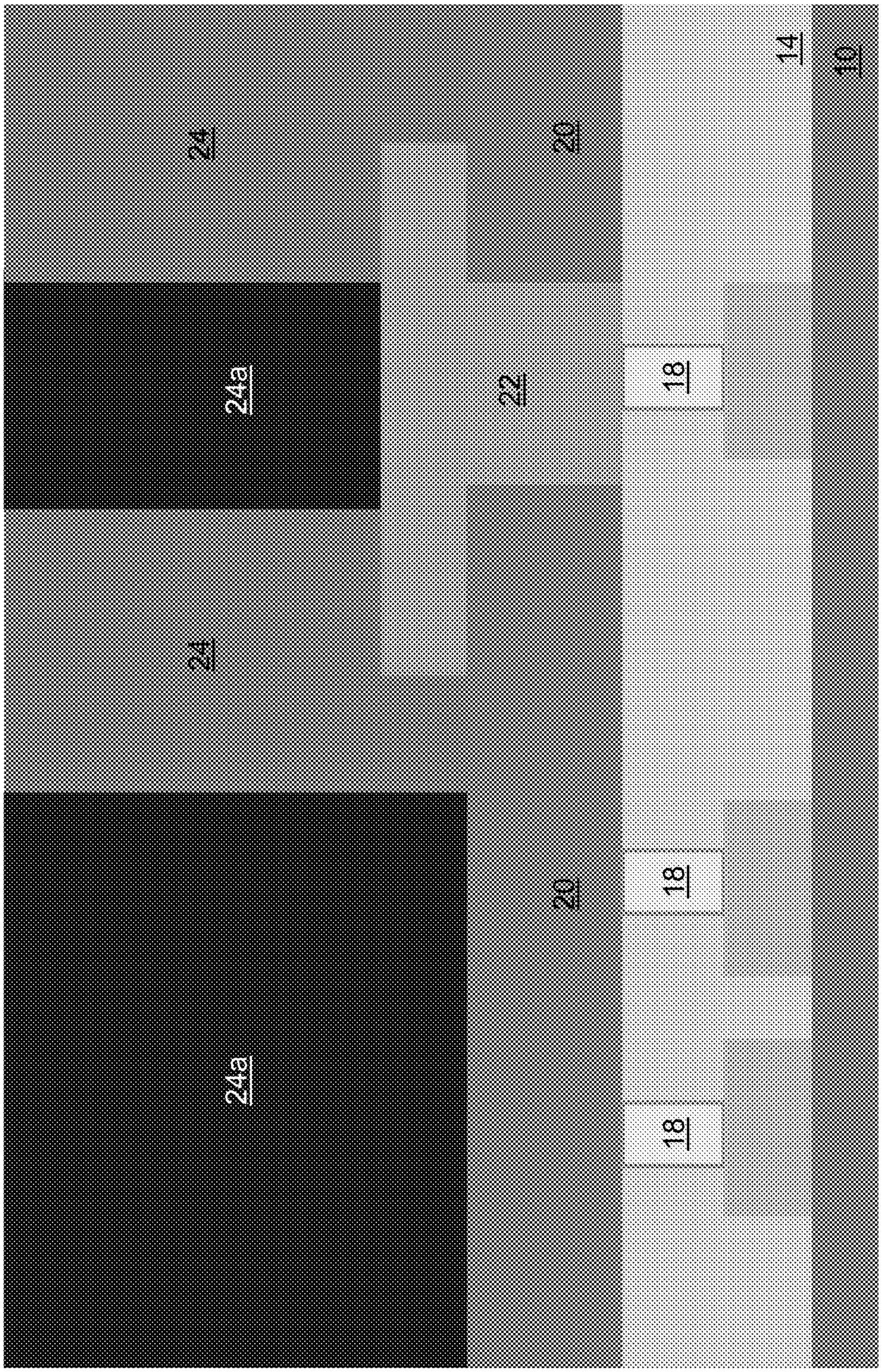
Figure 8:
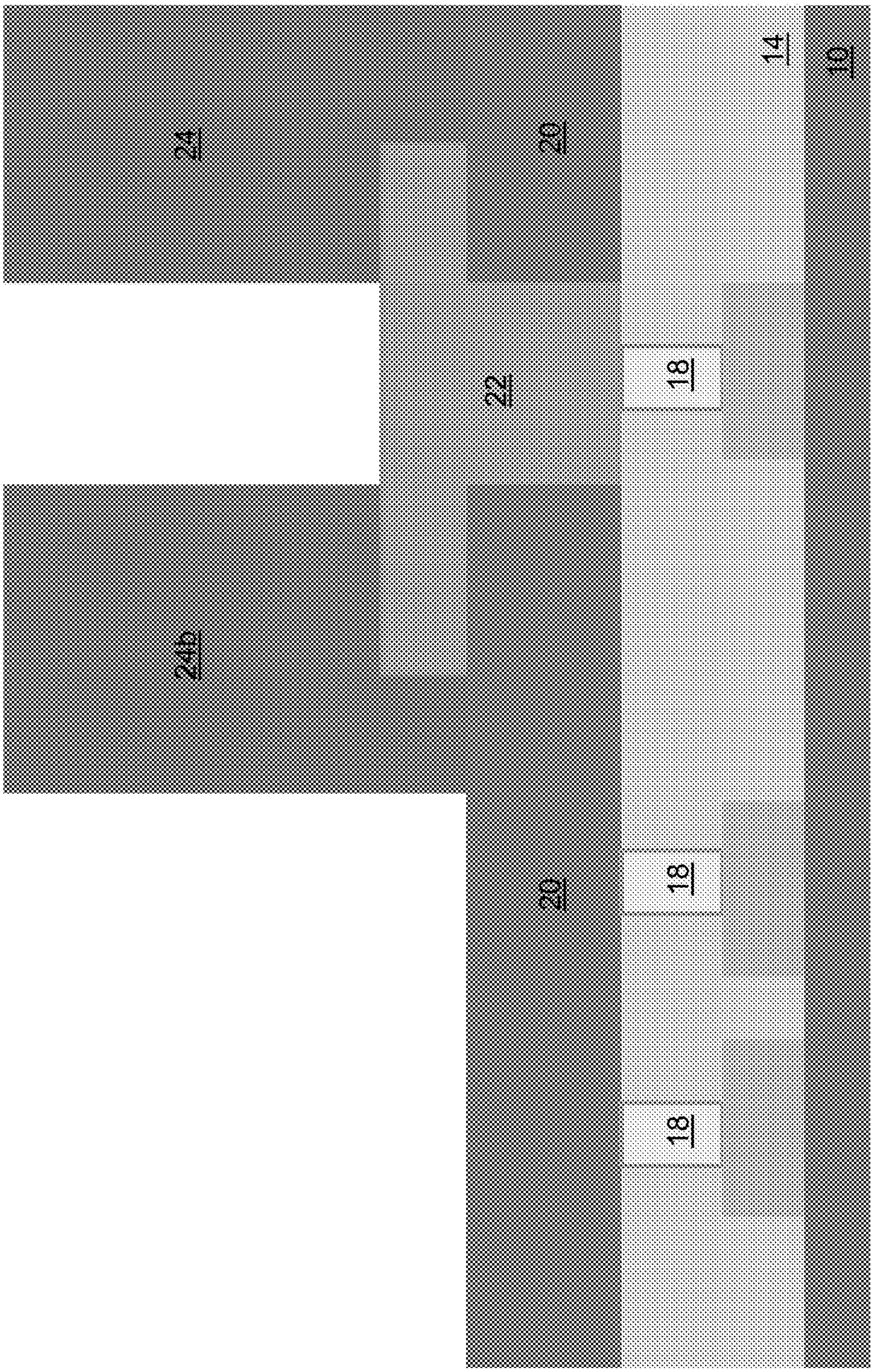
Figure 9:
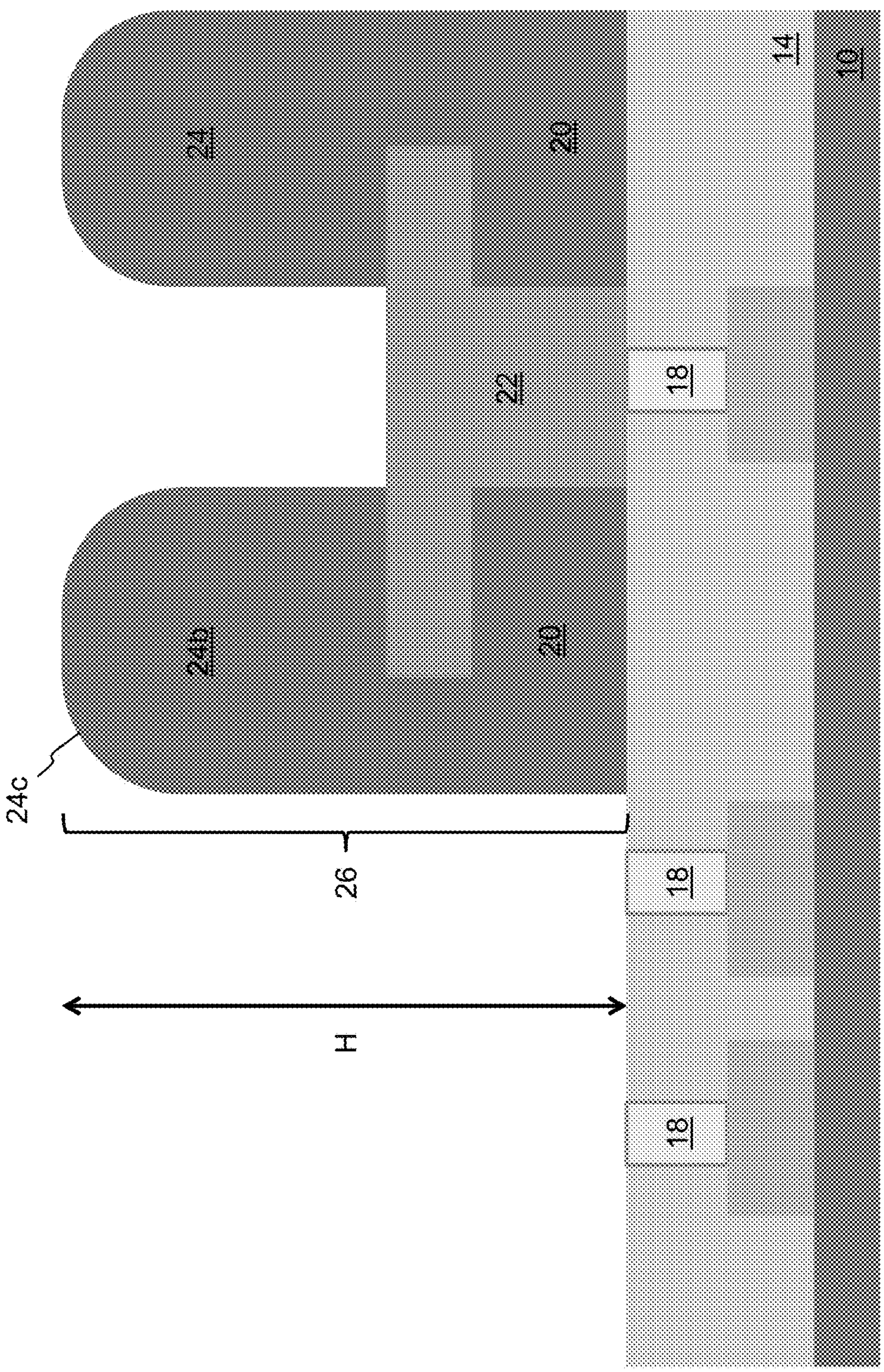

A second passivation layer 24 is formed over the structure, as shown in FIG. 6. This second passivation layer is formed of polyimide. Selective portions **24*a* of the polyimide 24 are exposed to photons in a photolithography process, as shown in FIG. 7. Alternately, a whole wafer contact mask could be used to do this patterning. The exposed portions 24*a* of the polyimide 24 are removed, leaving a ring 24*b* of the polyimide surrounding the Sn—Cu contacts 18 which will bonded to the die, as shown in FIG. 8. The ring of polyimide 24*b* is cured, rounding its edges so that its upper corners 24*c* are tapered. The passivation layer 20 inside the ring is removed through an etch, exposing the Sn—Cu contacts 18, as shown in FIG. 9. The resulting alignment structure 26 surrounding the Sn—Cu contacts includes a ring of polyimide 24*b* over a ring of the passivation material 20, which together have a total height of H relative to the SN—Cu contacts 18**. In a non-limiting example, the total height H of the alignment structure can be 15-20 μm.

Figure 10:
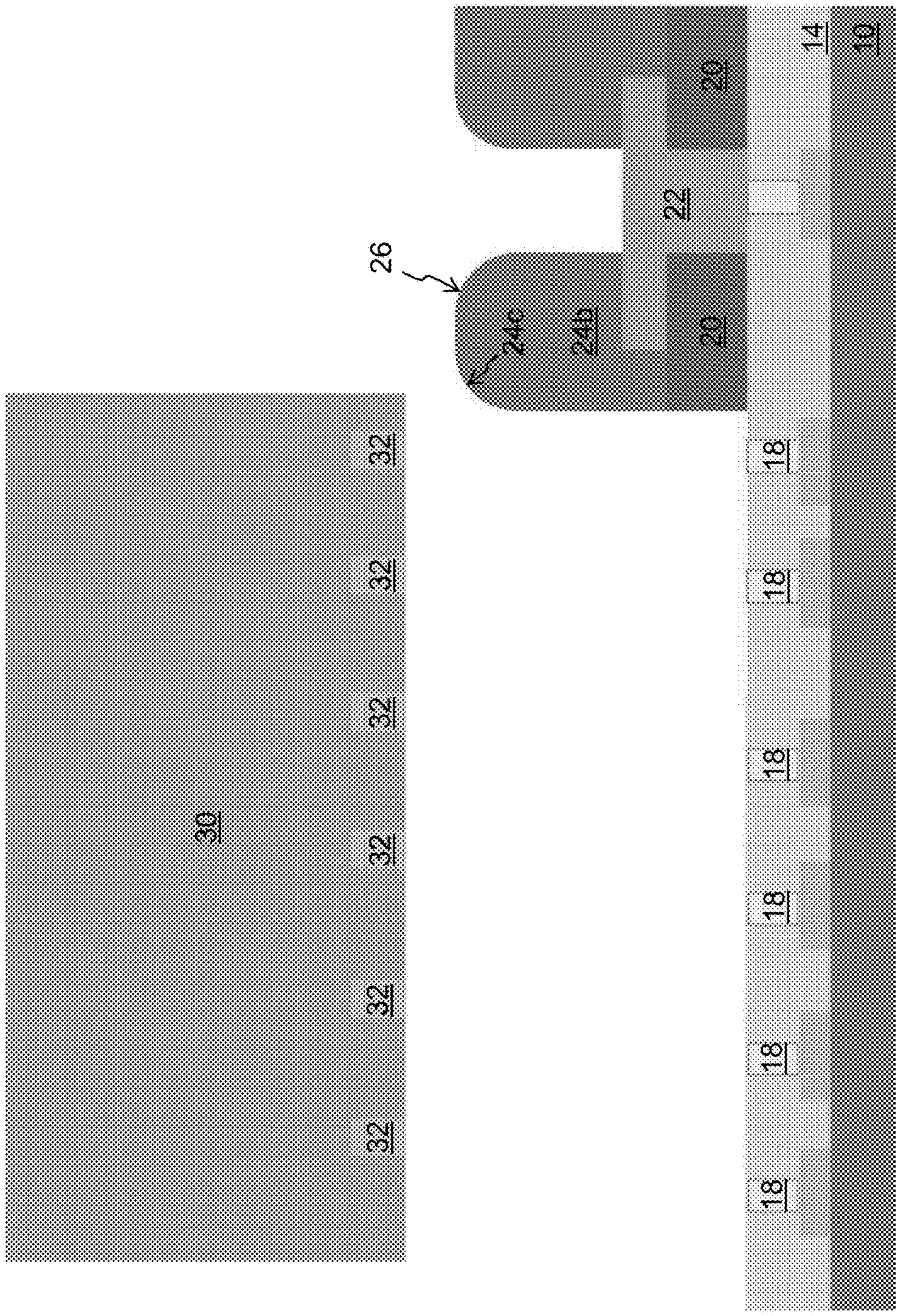
FIGS. 10-15 are side cross sectional side views illustrating the steps of aligning and bonding the die to the wafer.
Figure 11:
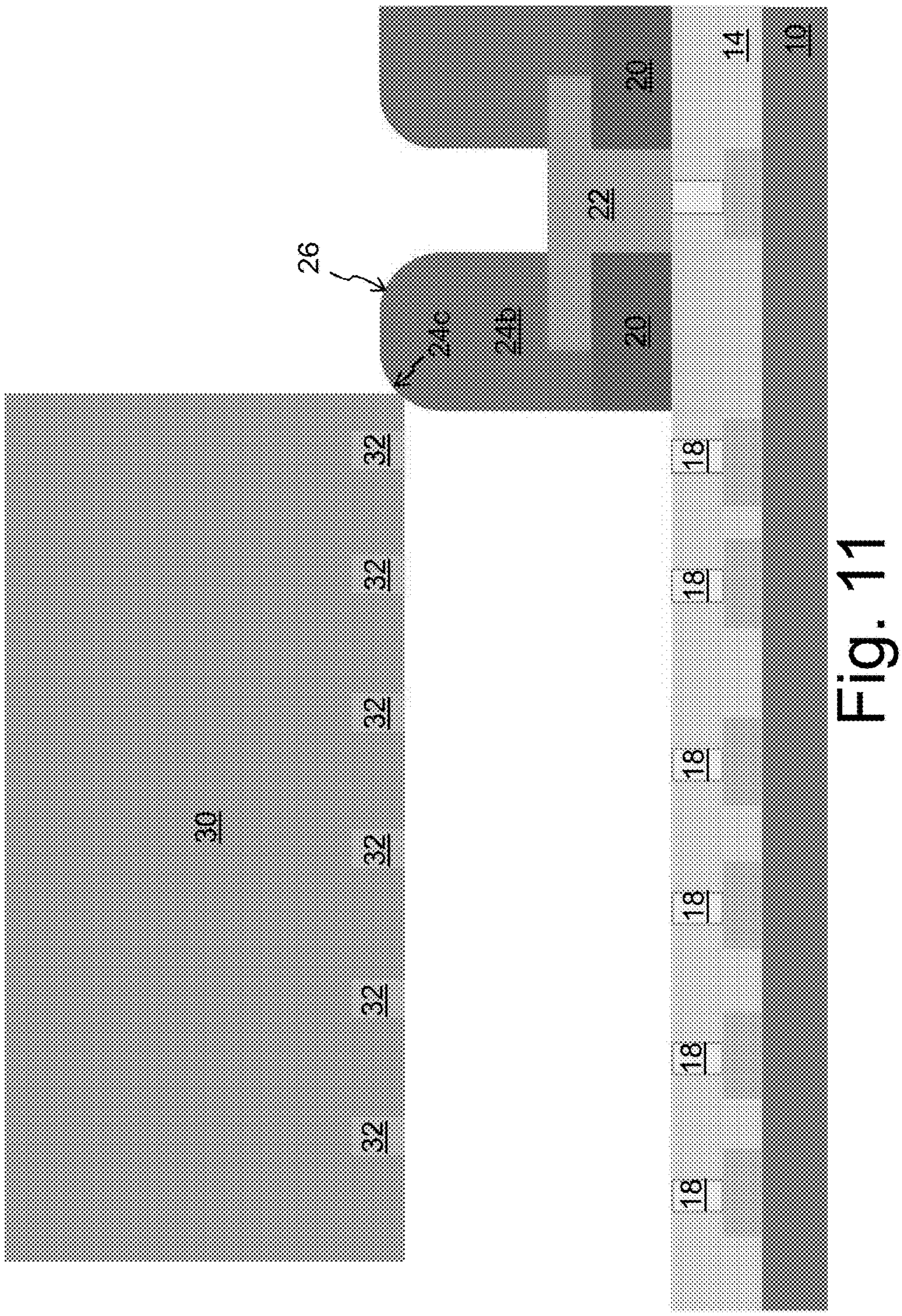
Figure 12:
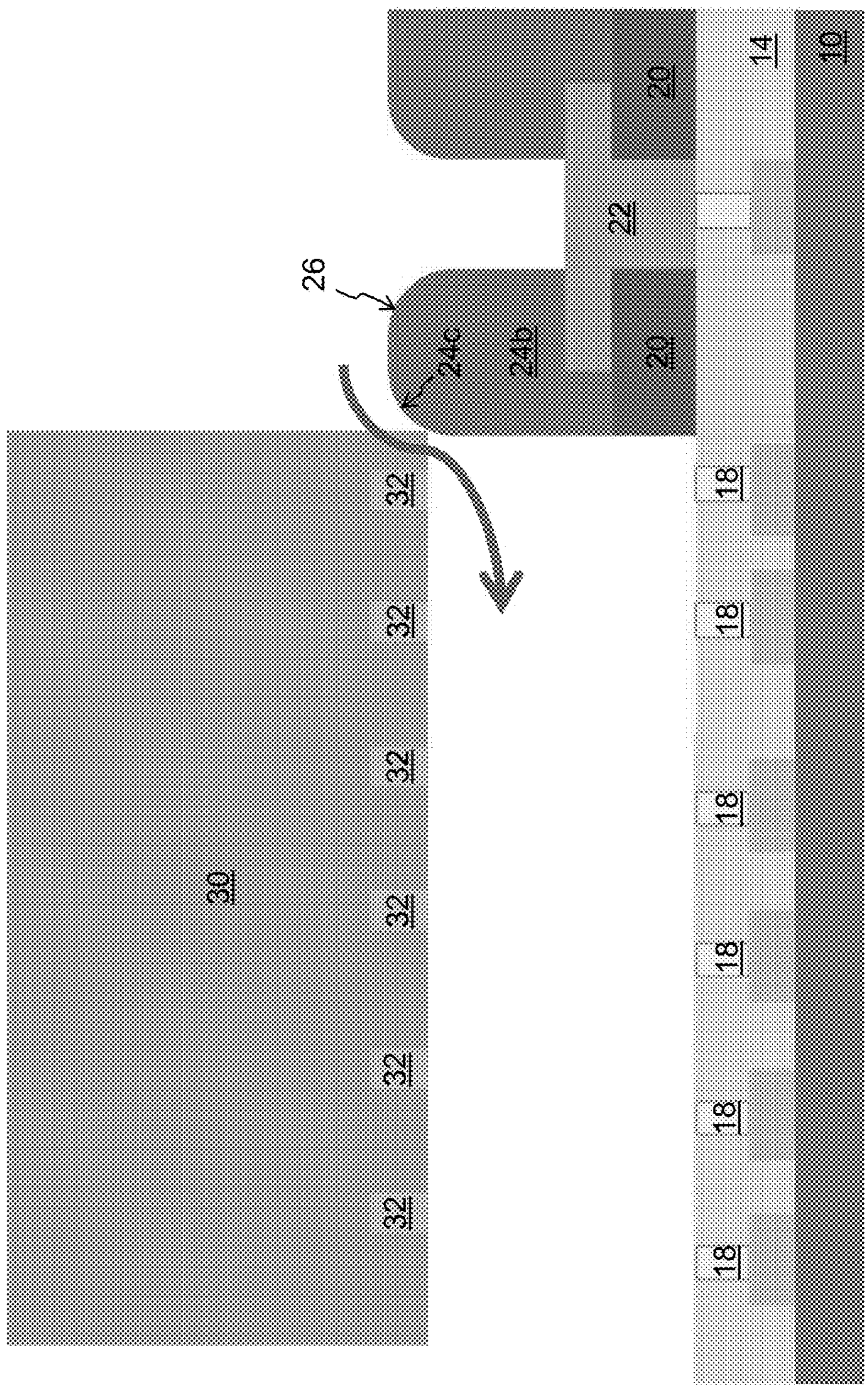
Figure 13:
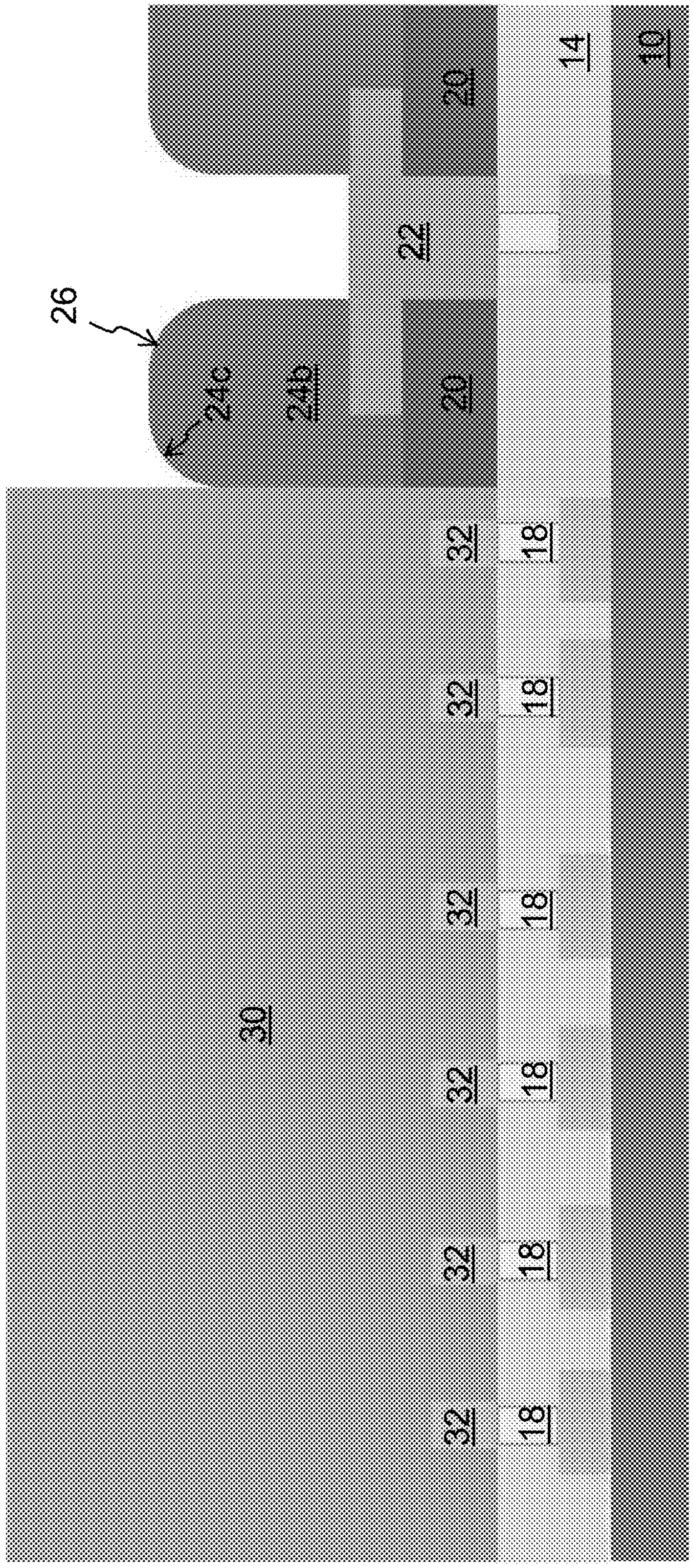
Figure 14:
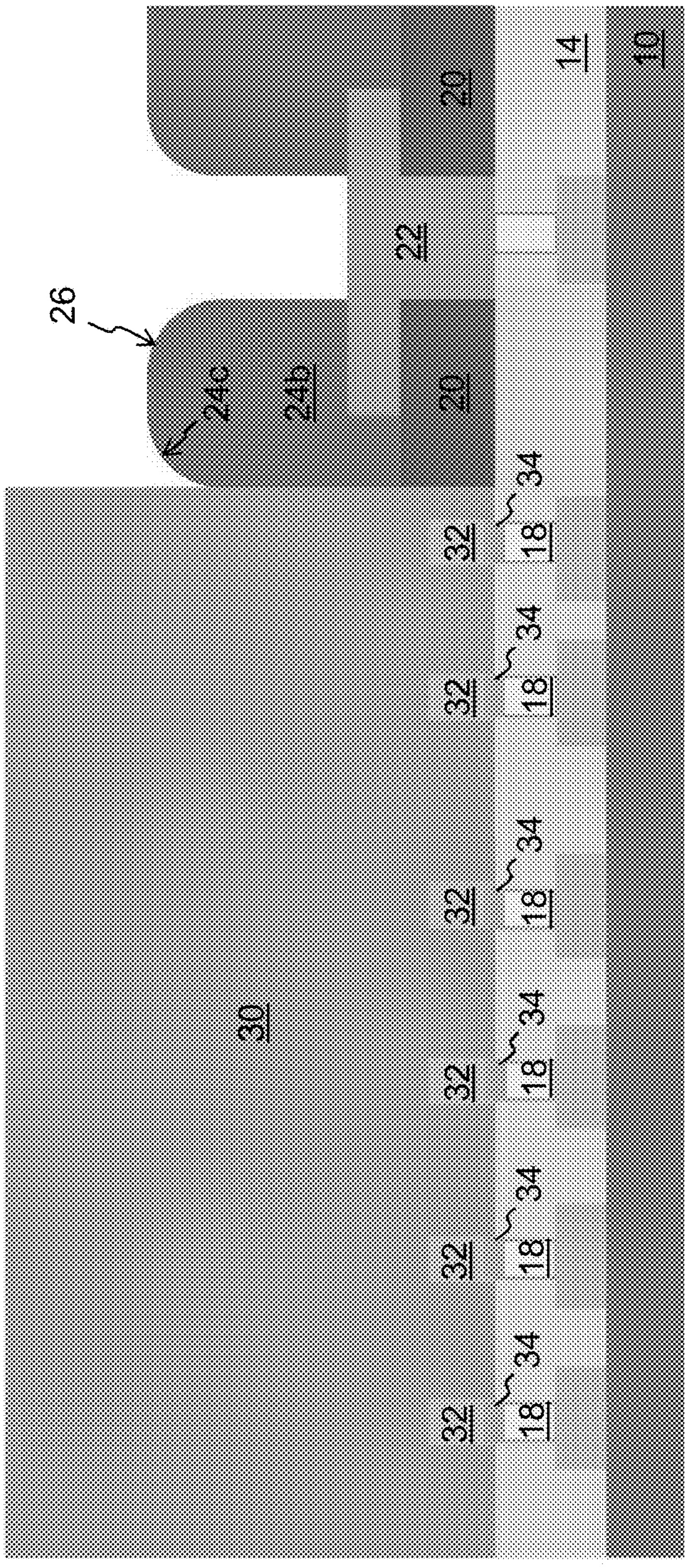
Figure 15:
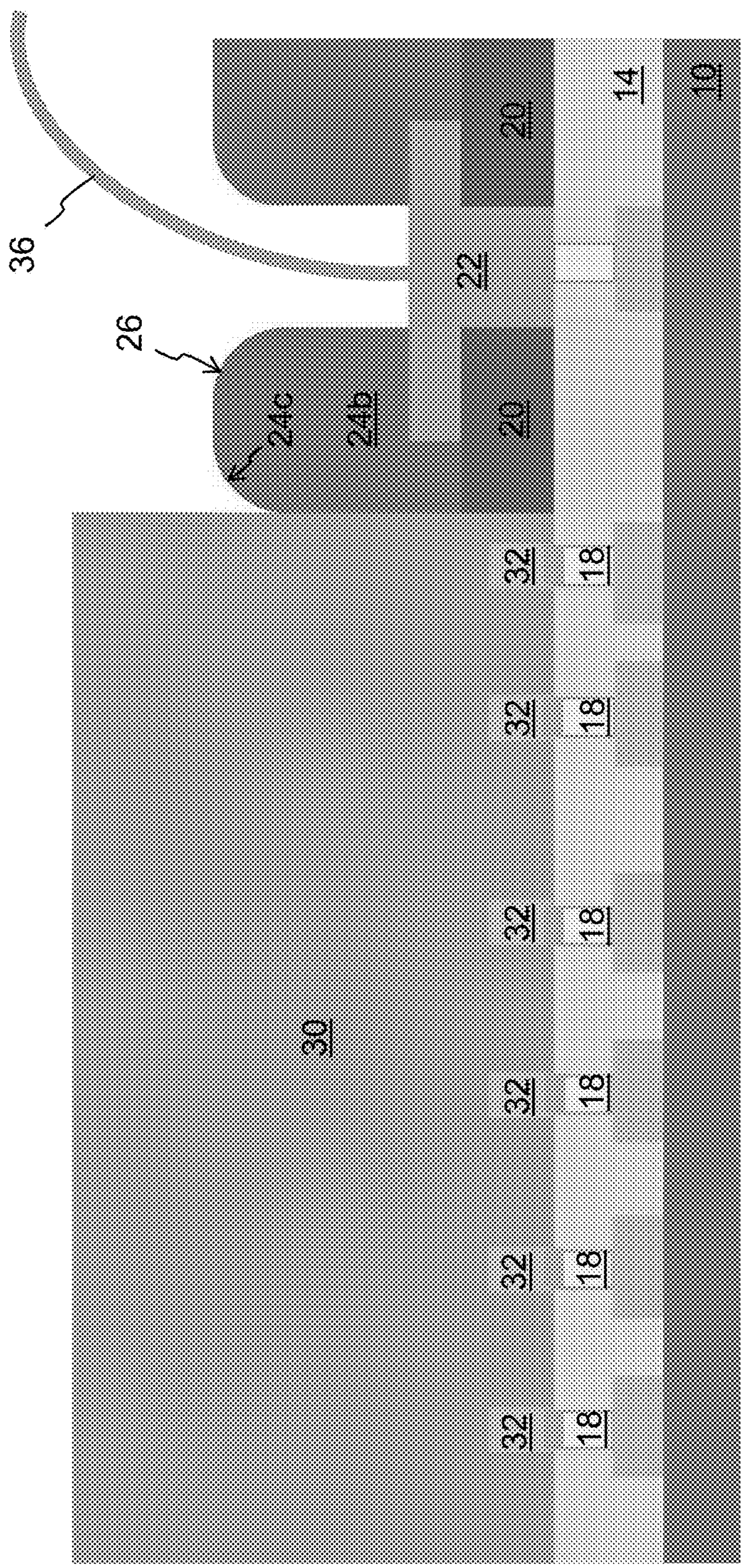

Using mechanical-robot assisted rough alignment, a die 30 (e.g., a 300 mm die with bottom surface electrical contacts 32, preferably made of copper) is placed over and aligned as best as possible to a wafer for bonding. As shown in FIG. 10, there may be some initial lateral misalignment. As shown in FIGS. 11-13, as the die 30 is lowered in a misaligned state, it makes contact with the tapered corner **24*c* of the polyimide 24*b* of the alignment structure 26, where the polyimide absorbs the impact (FIG. 11) and the sloped profile of the tapered corner 24*c* of the polyimide deflects the die laterally (FIG. 12) guiding it toward its proper alignment as it reaches wafer (FIG. 13). After final placement, the Sn—Cu contacts 18 of the wafer are in electrical contact with corresponding contacts 32 on the die 30. A certain amount of force is preferably applied, pressing the die 30 against the wafer, and heat is applied until the Sn—Cu contacts 18 of the wafer auto-solder to the copper contacts 32 of the die 30 (i.e., by creating solder bonds 34 between contacts 18 and 32 as shown in FIG. 14). After cooling, the bonding is complete, with solder bonds 34 connecting the wafer contacts 18 and die contacts 32 together. A wire 36 can be connected to the aluminum contact 22 after the die 30 is bonded in place, as shown in FIG. 15**.

The use of polyimide to guide the die in place (with the proper mechanical alignment) has many advantages. It allows for reliably bonding the die to the wafer with properly formed electrical connections even with smaller device geometries. The polyimide is photosensitive-light developable in tall and non-brittle alignment structures such as rings. The photosensitive polyimide develops away and may be used without an extra etch. The polyimide further serves as a mask layer to etch the passivation layer to expose the Sn—Cu contacts. The alignment structure 26 includes both an inorganic base (i.e., passivation layer 20) plus an organic upper portion (i.e., a polyimide top portion **24*b* as the elastic material to make contact with the die, absorb some of the shock of the initial contact, and provide the alignment correcting lateral force). The tapered sidewall 24*c* of the polyimide 24*b* effectively guides the die 30 while minimizing damage to either structure. The alignment tolerance of the via to via connection is greater than the variation in the opening and alignment ring critical dimension limits. In some cases, there may be some damage to the ring and the edge vias, which is why the polyimide 24*b*** is preferably sacrificial in the sense that it is preferably removed in its entirety after bonding. Moreover, it may be desirable in some applications for one or more of the electrical contacts adjacent to the polyimide ring to be dummy contacts and not actually used for electrical signals (i.e., no electrical connections).

The use of Sn—Cu alloy contacts for auto-soldering has many advantages as well. It reliably provides electrical connection formation for high density bonding (e.g. thousands of bonds per die), and is compatible with the polyimide alignment structures. The Sn—Cu contacts form solder connections to the counterpart copper contacts of the die simply by applying heat (and optionally some compressive force). The Sn—Cu material has a melting point low enough to allow self-soldering between the wafer and the die, without requiring higher temperatures that could damage the wafer or the die. The relative percentage of Sn to Cu can vary. Too much Sn as a percentage will make CMP difficult, and too much Cu as a percentage will make the etch difficult. It has been determined that 0.5-5% Cu and 95-99.5% Sn as percentage of overall composition ranges strike an ideal balance of percentage of overall composition between CMP processing, etch processing, and effective self-solder formation at sufficiently low enough temperatures. While forming contacts 18 using a homogenous deposited Sn—Cu alloy material is preferable, it is also possible to form contact 18 by depositing alternating and repeating discrete layers of Sn and Cu. Afterward, an anneal would be performed so the Sn is alloyed with the Cu.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, while the polyimide alignment structure may be a continuous ring around the location at which the die will be placed, it need not be ring shaped (e.g., could be square or any other shape matching or compatible with that of the die), and it need not be continuous (e.g., it could be one or more individual separate blocks of polyimide alignment structures having a partial ring shape, having multiple blocks of polyimide on opposite sides of the contacts, etc.). The self-soldering solution using Sn—Cu can be implemented without implementing the polyimide alignment structure, and vice versa, however together they provide significant advantages over prior art techniques of die/wafer bonding. Lowering the die onto the wafer includes vertically moving the die bottom surface toward the wafer top surface. However, placing these surfaces in contact can broadly be accomplished by vertically moving the two surfaces toward each other, which can be accomplished by moving the die toward a stationary wafer, moving the wafer toward a stationary die, or moving both the die and wafer toward each other at the same time. Finally, the polyimide alignment structure could be implemented without the underlying passivation layer 22.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of bonding a first substrate to a second substrate, wherein the first substrate includes first electrical contacts on a top surface of the first substrate, and wherein the second substrate includes second electrical contacts on a bottom surface of the second substrate, the method comprising:

forming a block of polyimide on the top surface of the first substrate, wherein the block of polyimide has a rounded upper corner; and vertically moving the top surface of the first substrate and the bottom surface of the second substrate toward each other until the first electrical contacts abut the second electrical contacts, wherein during the vertical moving, the second substrate makes contact with the rounded upper corner of the polyimide causing the first and second substrates to move laterally relative to each other.

2. The method of claim 1, wherein the polyimide block has a ring shape that encircles the first electrical contacts.

3. The method of claim 1, further comprising:

forming a layer of inorganic material disposed between the polyimide block and the first substrate.

4. The method of claim 3, wherein the inorganic material is one of oxide and nitride.

5. The method of claim 1, wherein each of the first electrical contacts includes Sn—Cu material.

6. The method of claim 5, wherein the Sn—Cu material includes between 0.5% to 5% Cu as a percentage of overall composition.

7. The method of claim 5, wherein each of the first electrical contacts further includes a metal block in contact with the Sn—Cu material.

8. The method of claim 5, further comprising:

applying heat to the first and second electrical contacts so that a solder connection is formed between each of the first electrical contacts and one of the second electrical contacts.

9. The method of claim 1, further comprising:

removing the polyimide block after the moving.

10. The method of claim 1, wherein the first substrate includes a third electrical contact on the top surface, the method further comprising:

forming an aluminum pad on the third electrical contact, wherein a portion of the polyimide block is directly on the aluminum pad; and connecting a wire to the aluminum pad.

11. The method of claim 1, wherein the forming of the polyimide block comprises:

forming a polyimide layer over the top surface of the first substrate;

exposing portions of the polyimide layer to light; and removing the portions of the polyimide layer that were exposed to light.

12. A method of bonding a first substrate to a second substrate, wherein the first substrate includes first electrical contacts on a top surface of the first substrate, and wherein the second substrate includes second electrical contacts on a bottom surface of the second substrate, the method comprising:

forming a first material over the top surface of the first substrate and over the first electrical contacts;

forming vias extending through the first material to expose the first electrical contacts;

forming Sn—Cu material in the vias;

forming a layer of polyimide over the top surface of the first substrate;

selectively removing one or more portions of the layer of polyimide, leaving a block of the polyimide over the top surface of the first substrate, wherein the block of polyimide has a rounded upper corner; and vertically moving the top surface of the first substrate and the bottom surface of the second substrate toward each other until the Sn—Cu material abuts the second electrical contacts, wherein during the vertical moving, the second substrate makes contact with the rounded upper corner of the polyimide causing the first and second substrates to move laterally relative to each other.

13. The method of claim 12, wherein the polyimide block has a ring shape that encircles the first electrical contacts.

14. The method of claim 12, further comprising:

forming a layer of inorganic material between the polyimide block and the first substrate.

15. The method of claim 14, wherein the inorganic material is one of oxide and nitride.

16. The method of claim 12, wherein the Sn—Cu material includes between 0.5% to 5% Cu as a percentage of overall composition.

17. The method of claim 12, further comprising:

applying heat to the Sn—Cu material so that a solder connection is formed between the Sn—Cu material and the second electrical contacts.

18. The method of claim 12, wherein the forming of the Sn—Cu material comprises:

forming discrete, alternating layers of Sn material and Cu material; and annealing the alternating layers so that the Sn material layers alloys with the Cu material layers.

19. The method of claim 12, wherein the forming of the Sn—Cu material comprises:

forming a layer of Sn—Cu alloy over the first material and in the vias; and removing the layer of Sn—Cu alloy over the first material while leaving the Sn—Cu alloy in the vias.

20. The method of claim 12, wherein the first substrate includes a third electrical contact on the top surface, the method further comprising:

forming an aluminum pad on the third electrical contact, wherein a portion of the polyimide block is directly on the aluminum pad; and connecting a wire to the aluminum pad.

21. The method of claim 12, further comprising:

removing the polyimide block after the moving.

* * * * *